(12) United States Patent
Chen et al.

(10) Patent No.: US 6,602,799 B2
(45) Date of Patent: Aug. 5, 2003

(54) METHOD OF FORMING A UNIFORM ULTRA-THIN GATE OXIDE LAYER

(75) Inventors: Chi-Chun Chen, Kaohsiung (TW); Wen Chang, Taipei (TW); Michael Chang, Hsin Chu (TW); Shih-Chang Chen, Tao-Yung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 09/954,879

(22) Filed: Sep. 17, 2001

(65) Prior Publication Data

US 2003/0054596 A1 Mar. 20, 2003

(51) Int. Cl.$^7$ ................................................ H01L 21/31
(52) U.S. Cl. ........................................ 438/773; 438/770
(58) Field of Search ................................. 438/197, 287, 438/694, 735, 738, 761–763, 769–770, 773, 791–792, 787

(56) References Cited

U.S. PATENT DOCUMENTS

| | | | | |
|---|---|---|---|---|
| 4,401,691 A | * | 8/1983 | Young | 438/402 |
| 6,037,273 A | * | 3/2000 | Gronet et al. | 438/773 |
| 6,207,586 B1 | * | 3/2001 | Ma et al. | 438/287 |
| 6,255,231 B1 | * | 7/2001 | Chen et al. | 438/773 |
| 6,410,456 B1 | * | 6/2002 | Gronet et al. | 427/255.37 |

* cited by examiner

Primary Examiner—Hoai Ho
Assistant Examiner—David Vu
(74) Attorney, Agent, or Firm—Tung & Associates

(57) ABSTRACT

A method of forming a highly uniform ultra-thin insulating gate oxide layer on a silicon wafer is presented where an oxide layer non-uniformity introduced at a processing temperature is compensated during a cooling step during which oxygen is added to give additional oxide layer growth thereby producing a substantially uniform oxide layer.

19 Claims, 3 Drawing Sheets

| | TEL-2nm | AVG. Tox (nm) | Win Unif. (±%) |
|---|---|---|---|
| | W/OR-dwO2 | 1.79 | 3.68 |
| | 1 % O2 Flow | 2.754 | 1.00 |
| | 0.16 % O2 Flow | 2.214 | 1.33 |
| | 0.05 % O2 Flow | 2.094 | 1.44 |
| | 0.05 % O2 in 900-800C only | 2.074 | 1.74 |
| | 0.04 % O2 in 900-800C only | 2.053 | 2.2 |
| | 0.06 % O2 in 900-800C only | 2.092 | 1.9 |

| | 1 | 2 | 3 |
|---|---|---|---|
| | TEL-2nm | AVG. Tox (nm) | Win Unif. (±%) |
| 4 | W/OR-dwO2 | 1.79 | 3.68 |
| 5 | 1 % O2 Flow | 2.754 | 1.00 |
| | 0.16 % O2 Flow | 2.214 | 1.33 |
| | 0.05 % O2 Flow | 2.094 | 1.44 |
| 6 | 0.05 % O2 in 900-800C only | 2.074 | 1.74 |
| | 0.04 % O2 in 900-800C only | 2.053 | 2.2 |
| | 0.06 % O2 in 900-800C only | 2.092 | 1.9 |

METHOD OF FORMING A UNIFORM ULTRA-THIN GATE OXIDE LAYER

FIELD OF THE INVENTION

The present invention is generally related to forming insulating oxide layers over semiconductor device structures, and more particularly, to a method of forming a highly uniform ultra-thin insulating gate oxide layer on a silicon wafer.

BACKGROUND OF THE INVENTION

In the semiconductor fabrication process, one of the more important processing steps is the formation of a high quality insulating gate oxide layer in the field of semiconductor devices fabrication. Many broad categories of commercial devices, such as electrically erasable programmable read only memories (EEPROMs), dynamic random access memories (DRAMs), and more recently, even high-speed basic logic functions, owe their commercialization to the reproducibility of high quality, very thin oxide layers. High quality dielectrics are needed in such devices to achieve satisfactory device performance both in terms of speed and longevity.

As in many aspects of semiconductor processing, current scaling efforts involve a set of trade-offs between higher packing density and better performance, and short channel effects. As process technologies scaled below about 2.0 microns, a series of design difficulties arose stemming from the semiconductor physics associated with short-channel devices. Hot carrier effects and sub-threshold leakage currents become much more problematic in short channel devices.

One technique to combat short channel effects has involved the scaling of gate dielectrics. To compensate for the potentially lower drive currents for a given short channel device, conventional silicon dioxide gate oxide layers are made as thin as possible to maximize drive current. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

Ultra-thin gate oxides (less than 3 nm) are required for achieving small/fast device technology. Uniformity is one of the major challenges in ultra-thin gate oxide fabrication since such uniformity is strongly correlated with gate oxide integrity. Present gate insulating layers fall short of the requirements necessary for future devices. Most conventional gate insulating layers are pure $SiO_2$ (silicon dioxide) films formed by thermal oxidation. Others employ a combination of a high temperature deposited $SiO_2$ layer on a thermally grown layer.

Generally, silicon dioxide layers can be grown within a temperature range from about 400° C. to about 1150° C. The growth process may be carried out in resistance-heated furnaces or in rapid thermal process chambers with heat provided by, for example, tungsten-halogen lamps. Typically, either a horizontal or a vertical furnace tube is used for this purpose. After loading a batch of wafers into a furnace, the furnace is heated to (ramped-up) a temperature suitable for oxidation of silicon. According to the prior art, wafers are then held at the elevated temperature (annealed) for a period of time to grow an oxide layer and then cooled (ramped-down) to a lower temperature.

During the oxidation process, as wafers are heated in the furnaces, a temperature profile within the furnace develops whereby the temperature at the wafer edge is higher than at the wafer center, leading to non-uniformity in oxide layer growth. The non-uniformity of the temperature profile and therefore the oxide layer uniformity increases as wafer size increases (e.g., from 200 mm to 300 mm). Further, the effects of such oxide layer non-uniformity become intolerable as oxide layer thickness is scaled down to the direct tunneling regime (e.g., less than 3 nm).

Silicon dioxide ($SiO_2$) can be grown by either a dry oxidation process or a wet oxidation process. In a dry oxidation process, oxygen is mixed with an inert carrier gas such as nitrogen, and is passed over a batch of process wafers at an elevated temperature. In a wet oxidation process, the process can be carried out by bubbling oxygen through high purity water maintained at a temperature of about 90° C. The temperature of the water determines the partial pressure of water vapor in the oxygen gas stream. The water vapor/oxygen gas mixture is then passed over the process wafers at a predetermined elevated temperature. The wet oxidation process may also be carried out in a pyrogenic steam oxidation process in which the oxidizing medium is water vapor formed by direct reaction between hydrogen and oxygen.

FIG. 1 shows a typical pyrogenic steam oxidation apparatus (10) according to the prior art. As shown in FIG. 1, a pyrogenic steam oxidation process may be carried out in horizontal furnace tube (12) situated in furnace (14). Inside the furnace tube (12), a wafer bolt (16) is used to hold a batch of silicon wafers (20) in an upright position. Oxygen gas (22) is fed into furnace tube (12) by carrier inert gas (e.g., nitrogen) (24) through inlet (30). Water vapor is thus formed by direct reaction between hydrogen and oxygen in furnace tube (12) acting as an oxidizing medium to produce $SiO_2$ on the silicon wafers (20). Unused water vapor and reaction by-products are passed out of furnace tube (12) through outlet (32).

The thermal budget required to achieve a given oxide film thickness is considerably smaller in a wet oxidation process compared to a dry oxidation process, making the wet oxidation preferable in many instances. However, the smallest fabricated dimension in a semiconductor device is frequently the gate-oxide thickness and the process control of a pyrogenic steam oxidation process proves more difficult compared to a dry oxidation process.

For example, in a 0.35 micron device, a 70 Angstrom gate oxide thickness must be controlled to within 7 Angstroms in order to meet stringent Industry reliability requirements. These requirements, for example, translate into a defect density of less than 0.5/cm3.

A process for growing such ultra-thin oxide layers therefore requires careful process control and furnace optimization. As the diameter of silicon wafers becomes larger, e.g., increased from 150 mm to 200 mm or 300 mm, larger furnace tubes must be utilized which further complicates the ambient control process. Furthermore, as device dimensions are further reduced below the 0.25 micron level, the thickness of the gate oxide layers will be likewise be reduced in scale to about 50 Angstroms.

Controlling the growth of an ultra-thin oxide layer of 50 Angstroms is difficult to control according to the steam oxidation process of the prior art shown in FIG. 1. One reason for such difficulty is simply the short pyro-time required for depositing such ultra-thin oxide layers. Another reason is the high annealing temperatures required to treat such ultra-thin oxide layers to obtain a high quality oxide. The annealing process for the ultra-thin oxide layers typically requires temperatures of about 1000° C. At this temperature, any residual moisture in the reaction chamber or in conduits leading to the reaction chamber may be a source of oxygen and cause unexpected further oxide growth on the wafers thereby leading to an unpredictable thickness of the oxide layer.

The process control difficulty according to the prior art is more clearly demonstrated in FIG. 2. Here, oxide thickness deposited on processed wafers in a vertically oriented furnace is shown versus time over a two-month period. Oxide thickness of wafers situated in an upper, central, and lower portion of the furnace are represented at (22). In FIG. 2, however, the variations in thickness are dominated by variations between oxidation runs. As demonstrated in FIG. 2, although the pyrolysis time was substantially constant as seen in the line of data at (24), the oxide thickness varied between about 40 and about 80 Angstroms over the two-month period from oxidation process (run) to oxidation process (run). Such fluctuations are well outside a maximum allowable standard deviation of about 10 percent.

It would therefore be advantageous to be able to process gate oxide layers with a high degree of uniformity both between successive oxidation runs as well as across a wafer diameter, leading to more reliable electrical performance and successful scale-down of semiconductor structures.

It is therefore an object of the invention to provide a process whereby gate oxide layers may be produced with a degree of uniformity unachievable according to the prior art, thereby allowing successful scale-down of semiconductor structures and manufacture of scaled-down semiconductor devices with reliable electrical performance.

SUMMARY OF THE INVENTION

To achieve the foregoing and other objects, and in accordance with the purposes of the present invention, as embodied and broadly described herein, the present invention provides a method of forming a uniform oxide layer on at least one substrate. The present invention also provides a method of forming a uniform ultra-thin oxide layer on at least one process wafer.

In a first embodiment, the method includes heating at least one substrate to a process temperature; passing a water vapor and oxygen gas mixture over the at least one substrate at the process temperature to form an oxide layer on the at least one substrate; annealing the oxide layer at an annealing temperature; cooling the oxide layer to a pre-determined lower temperature; and, adding an oxygen containing ambient during at least a portion of the cooling step to improve the oxide layer thickness uniformity.

In a related embodiment, the present invention provides a method where the heating is carried out in a furnace whereby an ambient pressure and type can be predictably controlled.

In further related embodiments, the present invention provides a method the water vapor and oxygen gas mixture is formed by passing oxygen through water or alternatively, by reacting gaseous hydrogen and oxygen to form water.

In yet further related embodiments, the oxygen containing ambient is added substantially simultaneously with a start of the cooling step, or alternatively, is added at a time following a start of the cooling step. The oxygen containing ambient may further be added over a period of time following a start of the cooling step provided the temperature is within about 300° C. of the annealing temperature.

In yet further related embodiments, the oxygen containing ambient includes at least oxygen. Further, the oxygen containing ambient includes oxygen and at least one inert gas. Further yet, the oxygen containing ambient includes oxygen and nitrogen. Further yet, the oxygen containing ambient includes a concentration of oxygen within a range of 0.01 percent to 2% percent by volume.

In yet further related embodiments, a deviation of the oxide layer thickness following the cooling step is maintained within a standard deviation of 10 percent over a substrate dimension. Further, the substrate dimension is at least 150 millimeters. Further yet, the substrate dimension is at least 150 millimeters. Further yet, the oxide layer thickness is at most about three nanometers.

In yet further related embodiments, the substrate exhibits a temperature profile during heating and annealing that includes a relatively higher temperature at a substrate edge. Further, the substrate includes a diametrical dimension. Further yet, the heating step is carried out in a tubular furnace.

In another embodiment, the present invention provides a method of forming a uniform ultra-thin oxide layer on at least one process wafer including the steps of: providing at least one process wafer within a furnace; heating the at least one process wafer to a process temperature profile; passing a water vapor and oxygen gas mixture over the at least one process wafer at a process temperature profile to form an oxide layer on the at least one process wafer; annealing the oxide layer at an annealing temperature profile; changing the temperature profile of the oxide layer such that the temperature profile is substantially reversed whereby relatively lower temperature portions of the oxide layer become relatively higher temperature portions of the oxide layer and relatively higher temperature portions of the oxide layer become relatively lower temperature portions of the oxide layer; and, adding an oxygen containing ambient for a period of time whereby additional oxidation takes place preferentially on a portion of the oxide layer where a temperature is relatively higher such that a resulting oxide layer over a face of the process wafer is rendered substantially uniform.

DETAILED DESCRIPTION OF THE PREFERRED EMBODIMENTS

Figure 1:
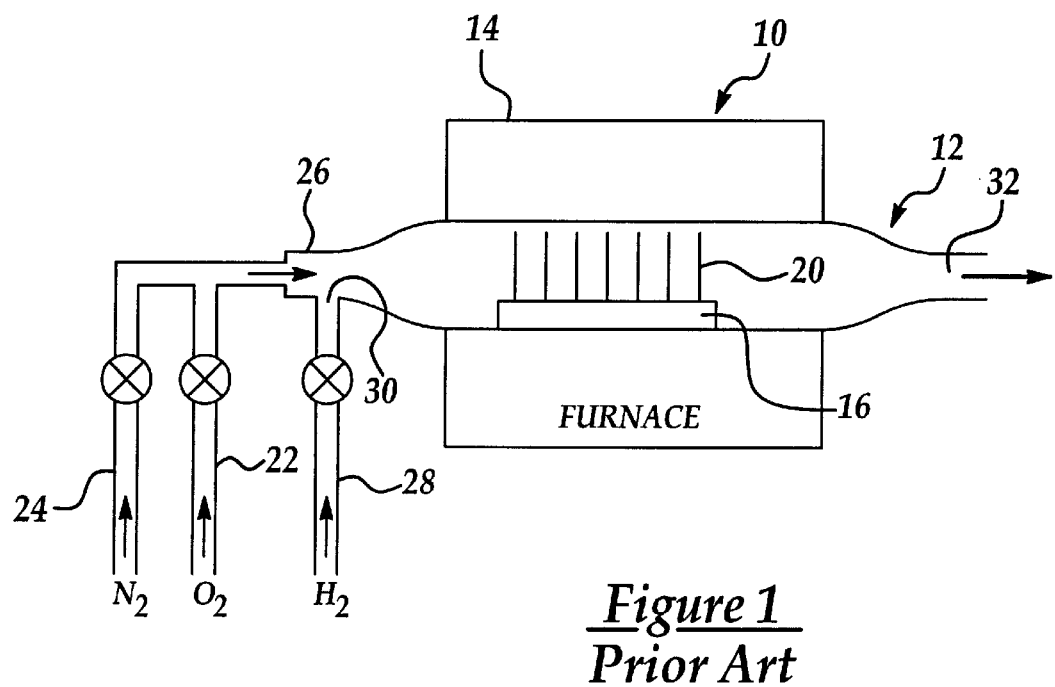
FIG. 1 is a schematic representation of a horizontally oriented tubular furnace for carrying out oxidations of silicon wafers according to the prior art.
Figure 2:
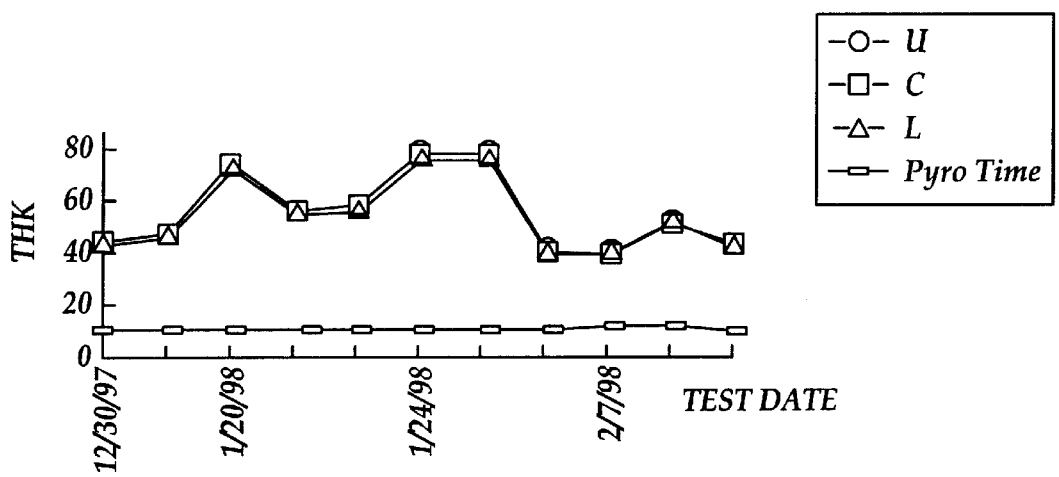
FIG. 2 is a graph of oxide layer thickness over a series of different oxidation runs according to the prior art.
Figures 3, 4:
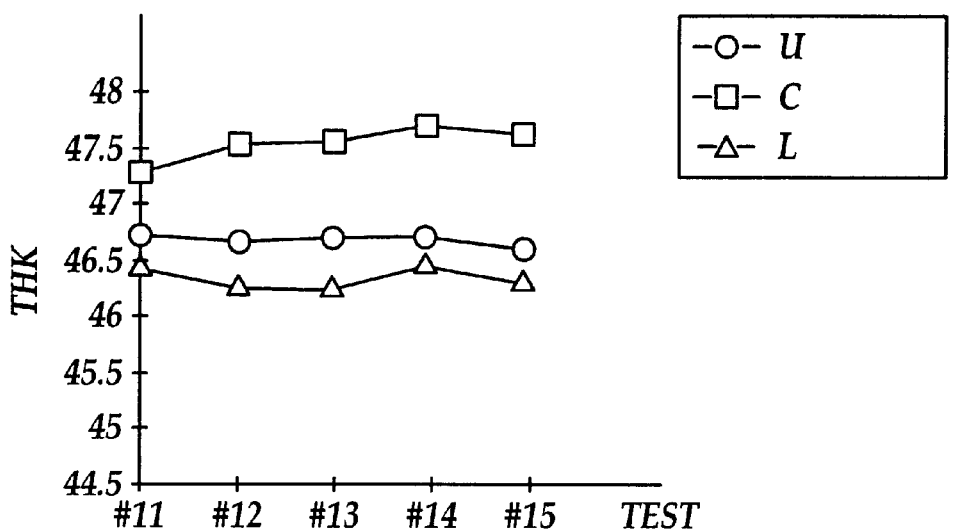
FIG. 3 is a graph of oxide layer thickness over a series of different oxidation runs.
FIG. 4 is a table of tabulated values of oxide layer thickness, and measures of wafer uniformity resulting from various process conditions.

As shown in FIG. 3, according to the present invention, gate uniformity between process runs is maintained within the maximum allowable standard deviation of about 10 percent. The term "about" as used herein is defined to be within 10 percent of the value recited.

FIG. 3 shows the thickness of oxide layers grown on wafers on the vertical axis versus the test run number on the horizontal axis. Three line of data are seen representing oxide thickness results from wafers situated in a central portion of a vertically oriented furnace (32), an upper portion of the furnace(34), and a lower portion of the furnace (36), respectively. The variation in thickness of the oxide layers between successive oxidation runs according to the present invention is well within a maximum standard deviation of 10%.

In another embodiment according to the present invention, the oxidation process may include a wet oxidation process including the steps of: heating at least one substrate to a process temperature; passing a water vapor and oxygen gas mixture over the at least one substrate at the process temperature to form an oxide layer on the at least one substrate; annealing the oxide layer at an annealing temperature; cooling the oxide layer to a pre-determined lower temperature; and, adding an oxygen containing ambient during at least a portion of a cooling period to a pre-determined lower temperature.

During the step of cooling down the furnace (oxide layer) according to the present invention, the temperature profile over a wafer surface (oxide layer) is such that the wafer edge temperature is lower than that of the wafer center, thereby causing oxide growth in the presence of oxygen to proceed at a higher rate at the wafer center. Consequently a non-uniformity in the oxide thickness arising during the heating or annealing process according to the prior art is compensated during the cooling step by preferential oxide growth at the wafer center.

In other words, during the heating and annealing step, the temperature profile is such that there is a relatively higher temperature at the wafer edge compared to a central portion of the wafer, thereby resulting in a higher rate of oxide growth at the wafer edges and consequently a non-uniform oxide layer. During the cooling process, the temperature profile is substantially reversed, thereby resulting in a higher rate of oxide growth at the wafer center.

In the process according to one aspect of the present invention, during the cooling process the temperature profile over a wafer is substantially reversed whereby a surface temperature may vary from a higher temperature at the central portion of the wafer to a lower temperature at the edge of the wafer by about from 1 to 5° C.

According to another aspect of the present invention, oxygen may be introduced following the annealing step while the temperature is near the annealing temperature. Under these circumstances, the additional oxidation near the higher annealing temperature improves the quality of the oxide layer.

In another aspect of the present invention, an amount of oxygen added to an inert gas e.g., nitrogen purge, and passed over the wafers during the cooling process may be varied whereby the final oxide thickness may be predictably and uniformly controlled. As an example, oxygen addition of from about 0.01 percent to about 2 percent by volume to a nitrogen purge may be satisfactory to give a uniform oxide layer thickness that is within a 10 percent maximum standard deviation over the wafer diameter. It will be appreciated by those skilled in the art that various combinations of cooling rate (temperature profile) and oxygen concentration may be routinely calibrated in order to achieve a desired final oxide thickness.

Also of great importance is the ability to control oxide layer thickness over the dimension of a given process wafer (within wafer uniformity) to within the maximum allowable standard deviation of 10 percent. In one aspect of the present invention, as shown in FIG. 4, 'within wafer uniformity' (3) is substantially improved compared to the prior art and within a maximum allowable standard deviation of 10%. FIG. 4 is a table of tabulated values of oxide layer thickness, and measures of wafer uniformity resulting from various process conditions. In the column at (41) are shown the process conditions during ramp-down (cooling) according to the present invention. The average thickness of the resulting oxide layer is shown in the column at (42). The 'within wafer uniformity' is shown in the column at (43). As shown along the row of the table (45), an ambient containing 1% (by volume) oxygen passed over the process wafers during the cooling (ramp-down) step improves 'within wafer uniformity' at column(43) by almost a factor of four compared to the process according to the prior art where no oxygen is present at row (44) in the ambient during cool down (ramp down).

Figure 5A:
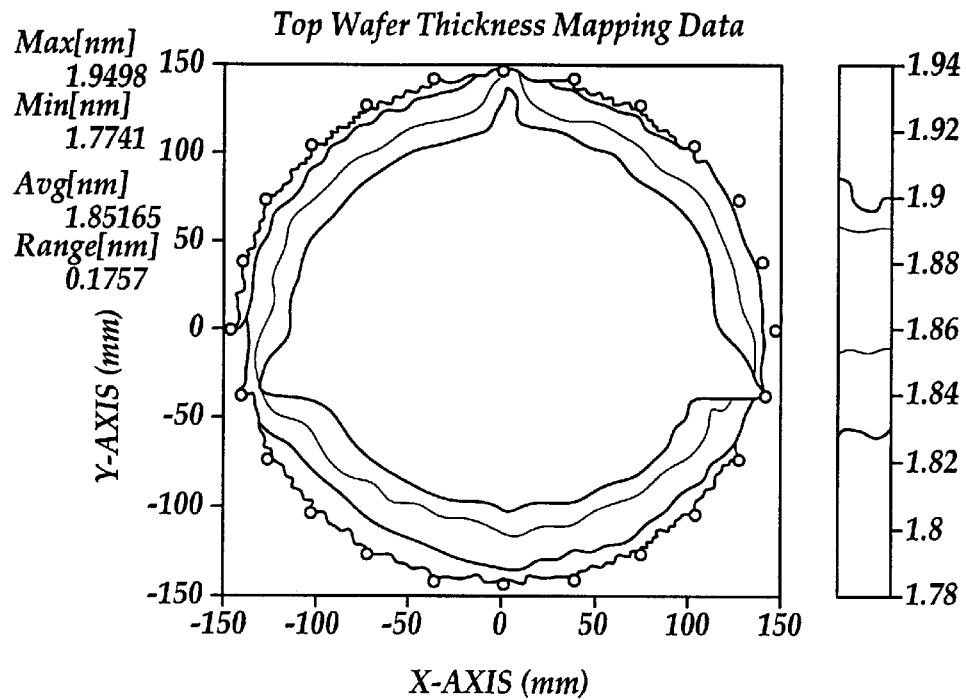
FIG. 5A is a graphical representation of oxide layer thickness over a wafer diameter of the prior art.
Figure 5B:
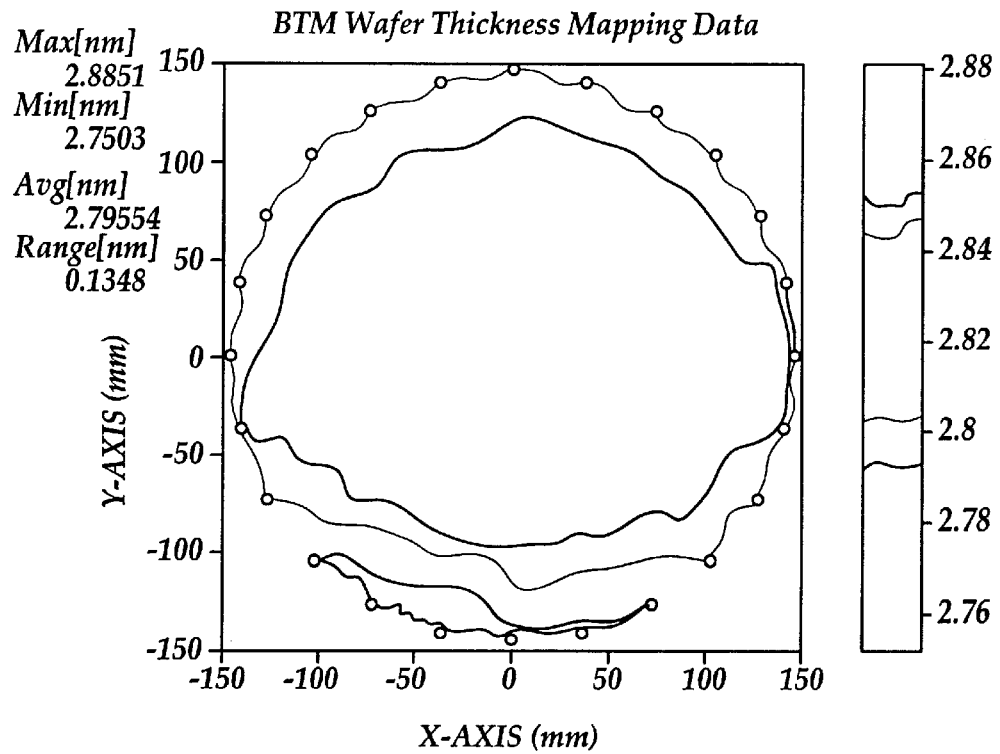
FIG. 5B is a graphical representation of oxide layer thickness over a wafer diameter of the present invention.

The significantly improved uniformity according to the present invention is shown graphically in FIGS. 5A and 5B. FIGS. 5A and 5B are graphic representation of a thickness measurements over the wafer diameter. Contiguous dark areas represent an acceptable level of uniform thickness with a lighter area representing an unacceptable deviation from uniformity. For example, it is shown in FIG. 5B that a 300 mm process wafer is substantially more uniform as indicated by the contiguous dark area at e.g., (53) over a diameter of the process wafer when a 1% oxygen containing ambient is passed over the wafer during the cooling (ramp down) step compared to the absence of any oxygen containing ambient in the sample shown in FIG. 5A where the non-uniform thickness is indicated by the presence of a light area at e.g., (51).

In another aspect of the present invention, an oxygen containing ambient may be passed over the process wafers during the cooling (ramp down) step for either the entire cooling period or optionally, for a portion of the cooling period. As shown in FIG. 4 ambient conditions upon cooling are shown in the column at (41). As can be seen for example, oxygen containing ambient is passed over the process wafer over the entire period of cooling e.g. at row (45) or for only a portion of the cool down period e.g., at row (46) from about 800° C. As can be seen in the column at (42), the thickness of an oxide layer under conditions at (45) is significantly thicker than under conditions at (46) and with somewhat more uniformity. As previously mentioned, it is preferable to expose the process wafer to an oxygen containing ambient at higher temperature since the quality of the oxide layer will be improved.

While the embodiments illustrated in the Figures and described above are presently preferred, it should be understood that these embodiments are offered by way of example only. Other embodiments may include; for example, the use of a different oxygen containing ambient or altering the temperature and time period for carrying out the oxidation process, or oxidizing a substrate with a different temperature profile. The invention is not limited to a particular embodiment, but extends to various modifications, combinations, and permutations that nevertheless fall within the scope of the appended claims.

What is claimed is:

1. A method of forming a uniform oxide layer on at least one substrate comprising the steps of:

heating at least one substrate to a process temperature;

passing a water vapor and oxygen gas mixture over the at least one substrate at the process temperature to form an oxide layer on the at least one substrate;

annealing the oxide layer at an annealing temperature;

cooling the oxide layer to a pre-determined lower temperature; and, adding an oxygen containing ambient comprising a concentration of oxygen within a range of about 0.01 percent to about 2% percent by volume during at least a portion of the cooling step to improve the oxide layer thickness uniformity.

2. The method of claim 1, wherein the step of heating the at least one substrate comprises controlled ambient pressure and temperature.

3. The method of claim 1, wherein the step of passing comprises forming the water vapor and oxygen gas mixture by passing oxygen through water.

4. The method of claim 1, wherein the step of passing comprises forming the water vapor and oxygen gas mixture by reacting gaseous hydrogen and oxygen to form water.

5. The method of claim 1, wherein the oxide layer is annealed within a temperature range of about 800 to about 1100 degrees Centigrade.

6. The method of claim 1, wherein the oxygen containing ambient is added substantially simultaneously with a start of the cooling step.

7. The method of claim 1, wherein the oxygen containing ambient is added at a time following a start of the cooling step.

8. The method of claim 1, wherein the oxygen containing ambient is added over a period of time following a start of the cooling step provided the oxide layer temperature is within about 300 degrees Centigrade of the annealing temperature.

9. The method of claim 1, wherein the oxygen containing ambient comprises at least oxygen.

10. The method of claim 1, wherein the oxygen containing ambient comprises oxygen and at least one inert gas.

11. The method of claim 1, wherein the oxygen containing ambient comprises oxygen and nitrogen.

12. The method of claim 1, wherein a deviation of the oxide layer thickness following the cooling step is formed comprising a standard deviation of less than about 10 percent.

13. The method of claim 1, wherein the at least one substrate comprises a diameter at least 150 millimeters.

14. The method of claim 1, wherein the oxide layer thickness is at most about three nanometers.

15. The method of claim 1, wherein the at least one substrate exhibits a temperature profile during the steps of heating and annealing that comprises a relatively higher temperature at the at least one substrate edge compared to a central portion.

16. The method of claim 15, wherein the temperature profile is substantially reversed during the cooling step.

17. The method of claim 1, wherein the at least one substrate comprises a semiconductor process wafer.

18. The method of claim 1, wherein the oxide layer uniformity is improved by preferential growth of the oxide layer growth at a center portion of the oxide layer during the cooling step.

19. A method of forming a uniform ultra-thin oxide layer on at least one semiconductor process wafer comprising the steps of:

providing at least one semiconductor process wafer within a furnace;

heating the at least one semiconductor process wafer to a process temperature;

passing a water vapor and oxygen gas mixture over the at least one semiconductor process wafer at the process temperature to form an oxide layer on the at least one semiconductor process wafer;

annealing the oxide layer to form an oxide layer temperature profile;

changing the oxide layer temperature profile such that the oxide layer temperature profile is substantially reversed whereby relatively lower temperature portions of the oxide layer become relatively higher temperature portions of the oxide layer and relatively higher temperature portions of the oxide layer become relatively lower temperature portions of the oxide layer; and, adding an oxygen containing ambient for a period of time whereby additional oxide growth takes place preferentially on the relatively higher temperature portions of the oxide layer such that the oxide layer thickness uniformity is improved.

* * * * *